United States Patent
Yamaguchi

(10) Patent No.: US 7,695,586 B2
(45) Date of Patent: Apr. 13, 2010

(54) PHOTOSENSITIVE EPOXY RESIN ADHESIVE COMPOSITION AND USE THEREOF

(75) Inventor: Miho Yamaguchi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/734,426

(22) Filed: Apr. 12, 2007

(65) Prior Publication Data

US 2007/0181248 A1  Aug. 9, 2007

Related U.S. Application Data

(62) Division of application No. 11/399,515, filed on Apr. 7, 2006, now abandoned.

(30) Foreign Application Priority Data

Apr. 19, 2005 (JP) ............... P. 2005-121754

(51) Int. Cl.
B32B 37/14 (2006.01)
B32B 38/04 (2006.01)
B29C 65/48 (2006.01)

(52) U.S. Cl. ................ 156/275.7; 156/307.1

(58) Field of Classification Search ............ 156/275.7, 156/307.1, 307.5, 308.2; 174/250, 254, 256, 174/259, 260; 29/825, 827, 832, 839, 840, 29/843, 860

See application file for complete search history.

(56) References Cited

U.S. PATENT DOCUMENTS

| 4,548,890 A | 10/1985 | Dickinson |
|---|---|---|
| 4,957,946 A | 9/1990 | Meier |
| 5,144,051 A | 9/1992 | Kessel |
| 5,252,694 A | 10/1993 | Willett |
| 5,264,325 A | 11/1993 | Allen |
| 5,432,049 A | 7/1995 | Fischer |
| 5,543,266 A | 8/1996 | Noguchi |
| 5,565,525 A * | 10/1996 | Morimoto et al. ........... 525/259 |
| 5,766,277 A | 6/1998 | DeVoe |
| 6,621,170 B2 * | 9/2003 | Yamamoto et al. .......... 257/783 |

FOREIGN PATENT DOCUMENTS

| JP | 2002069159 A | * | 3/2002 |
|---|---|---|---|
| JP | 2003-297876 | | 10/2003 |
| JP | 2003297876 A | * | 10/2003 |

OTHER PUBLICATIONS

Machine English Translation of JP 2003-297876.*
English Abstract of JP 2002-069159A.*
Machine English Translation of JP 2002-069159A.*
Mascia et al "Curing and morphology of epoxy resin-silica hybirds," J. Mater. Chem. 1998 vol. 8, No. 11 pp. 2417-2421.
Ito Dalsuke, "Ultraviolet-Curable Composition and Optical Disk Using the Same," (2003) Patent Abstracts of Japan-2003 313274.
Hashimoto Shinji, "One-Pack Type Sealant for Sealing Semiconductor" (1998), Patent Abstracts of Japan—62 277421.
European Search Report dated Aug. 16, 2006.

* cited by examiner

Primary Examiner—Philip C Tucker
Assistant Examiner—Sing P Chan
(74) Attorney, Agent, or Firm—Sughrue Mion, PLLC

(57) ABSTRACT

A photosensitive epoxy resin adhesive composition which is capable of forming a pattern by exposure to light through a photomask and development, and which, even after having formed a pattern in that manner, may still exhibit high adhesiveness when heated while keeping its pattern as such, as well as a photosensitive adhesive film which comprises the photosensitive epoxy resin adhesive composition. The photosensitive epoxy resin adhesive composition comprises an epoxy resin and a photo-acid generator, wherein the epoxy resin comprises a polyfunctional epoxy resin having an epoxy equivalent of from 100 to 300 g/eq and a polyfunctional epoxy resin having an epoxy equivalent of from 450 to 10000 g/eq.

17 Claims, No Drawings

PHOTOSENSITIVE EPOXY RESIN ADHESIVE COMPOSITION AND USE THEREOF

This is a divisional of application Ser. No. 11/399,515 filed Apr. 7, 2006 now abandoned; the disclosure of which is incorporated herein by reference.

FIELD OF THE INVENTION

The present invention relates to a photosensitive epoxy resin adhesive composition and its use; particularly to a photosensitive epoxy resin adhesive composition which is capable of forming a pattern by exposure to light through a photomask and development, and which, even after having formed a pattern in that manner, may still exhibit high adhesiveness with keeping its pattern as such by heating. The present invention also relates to a photosensitive adhesive film which comprises the photosensitive epoxy resin adhesive composition.

BACKGROUND OF THE INVENTION

With the recent tendency toward downsizing and increase in circuit integration of information communication appliances, the inner semiconductor packages for the appliances are being changed from lead frame-type packages to new-type high-density semiconductor packages such as BGA, CSP; and for example, for bonding a semiconductor chip to a circuit board or for bonding plural circuit boards together, use of a patterned adhesive is proposed (for example, see Reference 1).

In general, however, a photosensitive adhesive composition heretofore known in the art is patterned by exposing it to light and developing it, whereupon the resin used in the composition is crosslinked and cured. Accordingly, when an object is adhered to the thus-patterned adhesive composition layer, then it must be applied to the layer under thermal pressure at a high temperature. In addition, as so mentioned hereinabove, the conventional photosensitive adhesive composition is crosslinked and cured when it forms a pattern, and therefore even when an object is applied to the patterned layer under thermal pressure at such a high temperature, the adhesive composition could not be fully fluid even though it may be softened in some degree, and, as a result, there may occur partial voids in the adhesive interface between the adhesive and the object to be adhered. In general, therefore, it is difficult to obtain a sufficient adhesion strength between the adhesive and the object. Needless-to-say, semiconductor chips and circuit boards that are to be bonded with such an adhesive are damaged by heat, and primarily therefore, their adhesion at a high temperature must be preferably avoided, as mentioned above.

Reference 1: JP-A-2003-297876

SUMMARY OF THE INVENTION

An object of the present invention is to solve the above-mentioned problems with conventional photosensitive adhesive resin compositions and to provide a photosensitive epoxy resin adhesive composition which is capable of forming a pattern by exposure to light through a photomask and development, and which, even after having formed a pattern in that manner, may still exhibit high adhesiveness when heated while keeping its pattern as such, and to provide a photosensitive adhesive film that comprises the photosensitive epoxy resin adhesive composition.

The present invention provides a photosensitive epoxy resin adhesive composition comprising an epoxy resin and an photo-acid generator, wherein the epoxy resin comprises a polyfunctional epoxy resin having an epoxy equivalent of from 100 to 300 g/eq and a polyfunctional epoxy resin having an epoxy equivalent of from 450 to 10,000 g/eq. The present invention also provides a photosensitive adhesive film that comprises the photosensitive epoxy resin adhesive composition.

The photosensitive epoxy resin adhesive composition of the present invention may form a pattern through exposure to light and development, and, in addition, even after having formed a pattern, it may still exhibit high adhesiveness by heating and excellent moisture-resistant reliability and excellent chemical resistance while keeping its pattern as such. Accordingly, the photosensitive epoxy resin adhesive composition of the present invention may form a micropattern on a first adherend with it, and then, while keeping the pattern, a second adherend may be applied to it under thermal compression whereby a desired space may be formed between the thus-bonded adherends.

DETAILED DESCRIPTION OF THE INVENTION

The photosensitive epoxy resin adhesive composition of the present invention comprises an epoxy resin and an photo-acid generator, wherein the epoxy resin comprises a polyfunctional epoxy resin having an epoxy equivalent of from 100 to 300 g/eq, preferably from 150 to 280 g/eq (low-epoxy equivalent epoxy resin) and a polyfunctional epoxy resin having an epoxy equivalent of from 450 to 10,000 g/eq, preferably from 450 to 9,000 g/eq (high-epoxy equivalent epoxy resin).

In the photosensitive epoxy resin adhesive composition of the present invention, the low-epoxy equivalent epoxy resin has a low melt viscosity and has good wettability in adhesion, and, in addition, it may form a high-resolution pattern through exposure to light and development. The low-epoxy equivalent epoxy resin of this type is preferably a glycidyl ether-type epoxy resin, more preferably a bisphenol A-type, bisphenol F-type, biphenyl-type, novolak-type or fluorene-type glycidyl ether epoxy resin. On the other hand, the high-epoxy equivalent epoxy resin has plasticity by itself, and therefore, the photosensitive epoxy resin adhesive composition of the present invention which contains it may be formed into a film. For example, the high-epoxy equivalent epoxy resin of this type is preferably a bisphenol A-type phenoxy resin or a bisphenol F-type phenoxy resin. The phenoxy resin as referred to herein means an epoxy resin prepared by reaction of bisphenol A or bisphenol F with epichlorohydrin to thereby greatly increase its molecular weight.

In the present invention, the above-mentioned high-epoxy equivalent epoxy resin is combined with the above-mentioned low-epoxy equivalent epoxy resin to give a photosensitive epoxy resin adhesive composition which has excellent wettability to adherends, which may form a micropattern through exposure to light and development, which, even after having formed such a pattern, may still have high adhesiveness while keeping its pattern, and which may be formed into a film.

In the present invention, the epoxy resin preferably comprises from 5 to 90% by weight of the low-epoxy equivalent epoxy resin and from 10 to 95% by weight of the high-epoxy equivalent epoxy resin, more preferably from 10 to 60% by weight of the low-epoxy equivalent epoxy resin and from 40 to 90% by weight of the high-epoxy equivalent epoxy resin, furthermore preferably from 10 to 50% by weight of the low-epoxy equivalent epoxy resin and from 50 to 90% by weight of the high-epoxy equivalent epoxy resin (preferably 5:95 to 90:10 by weight, more preferably 10:90 to 60:40 by weight, furthermore preferably 10:90 to 50:50 by weight). If the proportion of the low-epoxy equivalent epoxy resin is too high, then the resulting composition may not be formed into a film even when it is combined with the above-mentioned high-epoxy equivalent epoxy resin. On the other hand, if the proportion of the high-epoxy equivalent epoxy resin is too high, then the resulting composition may hardly form a micropattern through exposure to light and development even when it is combined with the above-mentioned low-epoxy equivalent epoxy resin and, in addition, the composition may not be able to form adhesion having good moisture-resistant reliability and good chemical resistance between the adherends.

In the present invention, a photo-acid generator is used along with the above-mentioned combination of epoxy resins to give a photosensitive epoxy resin adhesive composition. Specifically, the photo-acid generator generates an acid when the photosensitive epoxy resin adhesive composition is exposed to light, and the acid catalyses crosslinking and cure the epoxy resin in the composition, and therefore, the composition is photosensitive. Any known photo-acid generators may be used herein, including, for example, various onium salts, especially triallylsulfonium salts and diallyliodonium salts with a counter anion such as $BF_4$, $PF_6$, $AsF_6$ or $SbF_6$. These are commercially available. In the present invention, the amount of the photo-acid generator to be in the composition may be generally from 1 to 15 parts by weight, preferably from 1 to 10 parts by weight relative to 100 parts by weight of the epoxy resin therein.

The photosensitive epoxy resin adhesive composition of the present invention may optionally contain, in addition to the above-mentioned low-epoxy equivalent epoxy resin, the high-epoxy equivalent epoxy resin and the photo-acid generator, any additives generally used in photosensitive adhesive compositions such as flame retardant, lubricant, leveling agent, etc.

The photosensitive epoxy resin adhesive composition of the present invention may be prepared and used as follows: The above-mentioned epoxy resin and the photo-acid generator and optional additive are dissolved in a suitable organic solvent such as dioxane or cyclohexane, and the resulting mixture is applied onto the surface of a first adherend, for example, a glass substrate, an organic substrate or a silicon substrate, for example, by the spin-coating method, and then dried to form a coating film thereon. Then, via a photomask, this is exposed to suitable active rays such as UV rays, electron rays or microwaves, whereupon the epoxy resin is crosslinked and cured by the action of the photo-acid generator, as mentioned above, and then this is developed, i.e., the non-exposed area of the coating film is dissolved and removed by the use of a developer solvent, and thereafter, if desired, this is subjected to post-exposure heating, whereby an adhesive composition of a desired pattern may be formed on the first adherend. For the developer, for example, herein usable is an organic solvent such as N-methyl-2-pyrrolidone or methyl ethyl ketone. For the development with such a developer, for example, the dipping method or the spraying method may be employed.

Another embodiment of the present invention is as follows: The above-mentioned epoxy resin, the photo-acid generator and optional additive(s) are dissolved in a suitable organic solvent such as dioxane, and this is applied onto a suitable substrate and dried to form a film. The resulting film may be transferred onto a first adherend, and, in the same manner as above, this is exposed to light via a photomask, whereupon the epoxy resin is crosslinked and cured by the action of the photo-acid generator, and then this is developed, and optionally further subjected to post-exposure heating, whereby an adhesive composition of a desired pattern may be formed on the adherend. The thickness of the thus-patterned adhesive composition layer formed on the adherend is generally from 10 to 100 μm, preferably from 20 to 50 μm.

Next, a second adherend is put on the adhesive composition layer thus formed on the first adherend to have a desired pattern, and heated under pressure generally at 90 to 200° C., preferably at 100 to 160° C. and generally under 1 to 200 $kg/cm^2$, preferably 10 t 100 $kg/cm^2$, whereby the first and second adherend may be bonded together with the patterned adhesive composition layer, while the pattern of the adhesive composition layer is kept as such.

Accordingly, the photosensitive epoxy resin adhesive composition of the present invention may be utilized as follows: A solution of the composition is applied onto a first adherend, or a film of the composition is transferred onto a first adherend, and then this is exposed to light and developed to form a suitable pattern on the first adherend so as to have a void apace thereon, and thereafter a second adherend is put on it and subjected to thermal compression whereby an adhesion of high reliability is formed between the first and second adherends and, during this, a desired gap space may be formed between the two, corresponding to the above-mentioned void space.

The present invention is described concretely with reference to the following Examples, which, however, are not intended to restrict the scope of the present invention.

EXAMPLE 1

10 parts by weight of bisphenol A-type epoxy resin having an epoxy equivalent of 250 g/eq, as a low-epoxy equivalent epoxy resin; 90 parts by weight of bisphenol F-type phenoxy resin having an epoxy equivalent of 8690 g/eq, as a high-epoxy equivalent epoxy resin; and 9 parts by weight of 4,4-bis[di(β-hydroxyethoxy) phenylsulfinio]phenylsulfide bis (hexafluoroantimonate) as a photo-acid generator were dissolved in dioxane to prepare a photosensitive epoxy resin adhesive composition as a varnish having a solid concentration of 50% by weight. The varnish was applied onto a polyester film, heated at 80° C. and dried to obtain a photosensitive adhesive film of the photosensitive epoxy resin adhesive composition having a thickness of 35 μm.

The photosensitive adhesive film was transferred onto the surface of a glass plate at 80° C. Using a high-pressure mercury lamp, the photosensitive adhesive film on the surface of the glass plate was exposed to light via a photomask at 1000 $mJ/cm^2$, and heated at 80° C. for 10 minutes after the exposure, and then developed with N-methyl-2-pyrrolidone as the developer, thereby forming a pattern of 100-μm wide lines aligned in parallel to each other at a pitch of 100 μm. Next, using a laminator, another glass plate was stuck onto the pattern at a temperature of 150° C., and while the void space at a pitch of 30 μm resulting from the pattern of the photosensitive adhesive film was still kept as such between the glass plates, the pair of the glass plates were adhered to each other.

In the same manner, the photosensitive adhesive film was transferred onto a wafer, then its surface was completely exposed to light, heated at 80° C. for 10 minutes after the exposure, and thereafter developed with a developer of N-methyl-2-pyrrolidone. This was cut into small pieces of 3 mm×3 mm in size, and thermally pressed against a slide glass plate at 150° C. under a pressure of 55 kg/cm² for 10 seconds. Then, this was further heated at 150° C. for 1 hour and was thus post-cured. The shear adhesive power measured was 5 MPa or more. These small pieces were tested for their moisture absorption by keeping them at a relative humidity of 90% for 200 hours and after the test, the shear adhesive power thereof was still 5 MPa or more.

EXAMPLE 2

A photosensitive epoxy resin adhesive composition was prepared in the same manner as in Example 1, except that 40 parts by weight of biphenyl-type epoxy resin having an epoxy equivalent of 186 g/eq was used as a low-epoxy equivalent epoxy resin, and 60 parts by weight of bisphenol F-type phenoxy resin having an epoxy equivalent of 4400 g/eq was used as a high-epoxy equivalent epoxy resin. This was formed into a photosensitive adhesive film having a thickness of 35 μm.

Also in the same manner as in Example 1, the photosensitive adhesive film was patterned, and via the thus-patterned adhesive composition layer having a void space at a pitch of 30 μm, a pair of glass plates were bonded to each other. Also in the same manner as in Example 1, the photosensitive adhesive film was transferred onto a wafer, then its surface was completely exposed to light, heated after the exposure, developed, and then cut into small pieces of 3 mm×3 mm in size, and thermally pressed against a slide glass plate. The shear adhesion power of the pieces measured was 5 MPa or more. After the moisture absorption test, the shear adhesion power of the small pieces was still 5 MPa or more.

EXAMPLE 3

A photosensitive epoxy resin adhesive composition was prepared in the same manner as in Example 1, except that 50 parts by weight of biphenyl-type epoxy resin having an epoxy equivalent of 186 g/eq was used as a low-epoxy equivalent epoxy resin, and 50 parts by weight of bisphenol F-type phenoxy resin having an epoxy equivalent of 4400 g/eq was used as a high-epoxy equivalent epoxy resin. This was formed into a photosensitive adhesive film having a thickness of 35 μm.

Also in the same manner as in Example 1, the photosensitive adhesive film was patterned on a glass plate, and via the thus-patterned adhesive composition layer having a void space at a pitch of 30 μm, a second glass plate was bonded to it. Also in the same manner as in Example 1, the photosensitive adhesive film was transferred onto a wafer, then its surface was completely exposed to light, heated after the exposure, developed, and then cut into small pieces of 3 mm×3 mm in size, and thermally pressed against a slide glass plate. The shear adhesion power of the pieces measured was 5 MPa or more. After the moisture absorption test, the shear adhesion power of the small pieces was still 5 MPa or more.

EXAMPLE 4

A photosensitive epoxy resin adhesive composition was prepared in the same manner as in Example 1, except that 40 parts by weight of novolak-type epoxy resin having an epoxy equivalent of 177 g/eq was used as a low-epoxy equivalent epoxy resin, and 60 parts by weight of bisphenol F-type phenoxy resin having an epoxy equivalent of 8690 g/eq was used as a high-epoxy equivalent epoxy resin. This was formed into a photosensitive adhesive film having a thickness of 35 μm.

Also in the same manner as in Example 1, the photosensitive adhesive film was patterned on a glass plate, and via the thus-patterned adhesive composition layer having a void space at a pitch of 30 μm, a second glass plate was bonded to it. Also in the same manner as in Example 1, the photosensitive adhesive film was transferred onto a wafer, then its surface was completely exposed to light, heated after the exposure, developed, and then cut into small pieces of 3 mm×3 mm in size, and thermally pressed against a slide glass plate. The shear adhesion power of the pieces measured was 5 MPa or more. After the moisture absorption test, the shear adhesion power of the small pieces was still 5 MPa or more.

EXAMPLE 5

A photosensitive epoxy resin adhesive composition was prepared in the same manner as in Example 1, except that 10 parts by weight of novolak-type epoxy resin having an epoxy equivalent of 177 g/eq was used as a low-epoxy equivalent epoxy resin, and 90 parts by weight of bisphenol A-type phenoxy resin having an epoxy equivalent of 475 g/eq was used as a high-epoxy equivalent epoxy resin. This was formed into a photosensitive adhesive film having a thickness of 35 μm.

Also in the same manner as in Example 1, the photosensitive adhesive film was patterned on a glass plate, and via the thus-patterned adhesive composition layer having a void space at a pitch of 30 μm, a second glass plate was bonded to it. Also in the same manner as in Example 1, the photosensitive adhesive film was transferred onto a wafer, then its surface was completely exposed to light, heated after the exposure, developed, and then cut into small pieces of 3 mm×3 mm in size, and thermally pressed against a slide glass plate. The shear adhesion power of the pieces measured was 5 MPa or more. After the moisture absorption test, the shear adhesion power of the small pieces was still 5 MPa or more.

COMPARATIVE EXAMPLE 1

In the same manner as in Example 1, a photosensitive epoxy resin adhesive composition was prepared as a varnish thereof having a solid concentration of 50% by weight, except that a high-epoxy equivalent epoxy resin was not used, and 100 parts by weight of bisphenol A-type epoxy resin having an epoxy equivalent of 250 g/eq was used as a low-epoxy equivalent epoxy resin and 9 parts by weight of the same photo-acid generator as in Example 1 was used. The varnish was applied onto a polyester film, heated at 80° C. and dried, but the coating film was extremely sticky. The varnish could not be formed into a dry photosensitive adhesive film.

COMPARATIVE EXAMPLE 2

In the same manner as in Example 1, a photosensitive epoxy resin adhesive composition was prepared as a varnish thereof having a solid concentration of 50% by weight, except that a low-epoxy equivalent epoxy resin was not used, and 100 parts by weight of bisphenol F-type epoxy resin having an epoxy equivalent of 8690 g/eq was used as a high-epoxy equivalent epoxy resin and 9 parts by weight of the same photo-acid generator as in Example 1 was used. The varnish was applied onto a polyester film, heated at 80° C. and dried to obtain a photosensitive adhesive film having a thickness of 35 μm.

Also in the same manner as in Example 1, the photosensitive adhesive film was transferred onto the surface of a glass plate, exposed to light via a photomask, heated after the exposure, and developed, whereupon the film was swollen as a whole and could not form a pattern.

COMPARATIVE EXAMPLE 3

In the same manner as in Example 1, a photosensitive epoxy resin adhesive composition was prepared as a varnish thereof having a solid concentration of 50% by weight, except that a low-epoxy equivalent epoxy resin was not used, and 50 parts by weight of bisphenol A-type epoxy resin having an epoxy equivalent of 475 g/eq and 50 parts by weight of bisphenol F-type epoxy resin having an epoxy equivalent of 8690 g/eq were used as high-epoxy equivalent epoxy resins, and 9 parts by weight of the same photo-acid generator as in Example 1 was used. The varnish was applied onto a polyester film, heated at 80° C. and dried to obtain a photosensitive adhesive film having a thickness of 35 µm.

Also in the same manner as in Example 1, the photosensitive adhesive film was patterned on a glass plate, and via the thus-patterned adhesive composition layer having a void space at a pitch of 30 µm, a second glass plate was bonded to it. On the other hand and in the same manner as in Example 1, the photosensitive adhesive film was transferred onto a wafer, then its surface was completely exposed to light, heated after the exposure, developed, and then cut into small pieces of 3 mm×3 mm in size, and thermally pressed against a slide glass plate. The shear adhesion power of the pieces measured was 2 MPa. After the moisture absorption test, the shear adhesion power of the small pieces was less than 1 MPa.

While the invention has been described in detail and with reference to specific embodiments thereof, it will be apparent to one skilled in the art that various changes and modifications can be made therein without departing from the scope thereof.

This application is based on Japanese patent application No. 2005-121754 filed Apr. 19, 2005, the entire contents thereof being hereby incorporated by reference.

What is claimed is:

1. A method of bonding comprising:
    applying a photosensitive epoxy resin adhesive composition to a first adhered;
    exposing the photosensitive epoxy resin adhesive composition to light through a photomask;
    developing the photosensitive epoxy resin adhesive composition to form a pattern so as to have a void space;
    applying a second adherend on the patterned photosensitive epoxy resin adhesive composition; and
    subjecting the first and second adherends to thermal compression;
    wherein the photosensitive epoxy resin adhesive composition comprises an epoxy resin comprising a first polyfunctional epoxy resin having an epoxy equivalent of from 100 to 300 g/eq and a second polyfunctional epoxy resin having an epoxy equivalent of 4,400 to 10,000 g/eq., and a photo-acid generator in an amount of from 1 to 15 parts by weight.

2. The method of claim 1, wherein an adhesion is formed between the first and second adherends.

3. The method of claim 1, wherein a desired gap space is formed between the first and second adherends corresponding to the void space.

4. The method of claim 1, wherein the photosensitive epoxy resin adhesive composition applied to the first adherend is a solution.

5. The method of claim 1, wherein the photosensitive epoxy resin adhesive composition applied to the first adherend is a film.

6. The method of claim 1, further comprising heating the exposed photosensitive epoxy resin adhesive composition.

7. The method of claim 1, wherein the thickness of the patterned composition layer is from 10 to 100 µm.

8. The method of claim 7, wherein the thickness of the patterned composition layer is from 20 to 50 µm.

9. The method of claim 1, wherein the thermal compression is conducted at a temperature of 90 to 200° C.

10. The method of claim 9, wherein the thermal compression is conducted at a temperature of 100 to 160° C.

11. The method of claim 1, wherein the thermal compression is conducted under a pressure of 1 to 200 kg/cm$^2$.

12. The method of claim 11, wherein the thermal compression is conducted under a pressure of 10 to 100 kg/cm$^2$.

13. The method of claim 1, wherein the first polyfunctional epoxy resin has an epoxy equivalent of from 150 to 280 g/eq.

14. The method of claim 1, wherein the second polyfunctional epoxy resin has an epoxy equivalent of from 4400 to 9,000 g/eq.

15. The method of claim 1, wherein the ratio of the first polyfunctional epoxy resin and the second polyfunctional epoxy resin is 5:95 to 90:10 by weight.

16. The method of claim 15, wherein the ratio of the first polyfunctional epoxy resin and the second polyfunctional epoxy resin is 10:90 to 60:40 by weight.

17. The method of claim 16, wherein the ratio of the first polyfunctional epoxy resin and the second polyfunctional epoxy resin is 10:90 to 50:50 by weight.

* * * * *